United States Patent
Li (10) Patent No.: US 12,213,349 B2
(45) Date of Patent: Jan. 28, 2025

(54) DISPLAY PANEL AND DISPLAY DEVICE HAVING OPENING REGIONS AND NON-OPENING REGIONS

(71) Applicant: Hubei Yangtze Industrial Innovation Center Of Advanced Display Co., Ltd., Wuhan (CN)

(72) Inventor: Jiaxin Li, Wuhan (CN)

(73) Assignee: Hubei Yangtze Industrial Innovation Center of Advanced Display Co., Ltd., Wuhan (CN)

( * ) Notice: Subject to any disclaimer, the term of this patent is extended or adjusted under 35 U.S.C. 154(b) by 585 days.

(21) Appl. No.: 17/344,222

(22) Filed: Jun. 10, 2021

(65) Prior Publication Data
US 2021/0305339 A1 Sep. 30, 2021

(30) Foreign Application Priority Data
Dec. 23, 2020 (CN) .......................... 202011538763.3

(51) Int. Cl.
| | |
|---|---|
| H10K 59/124 | (2023.01) |
| H10K 50/813 | (2023.01) |
| H10K 50/814 | (2023.01) |
| H10K 59/122 | (2023.01) |
| H10K 59/123 | (2023.01) |

(52) U.S. Cl.
CPC ......... H10K 59/124 (2023.02); H10K 50/813 (2023.02); H10K 50/814 (2023.02); H10K 59/122 (2023.02); H10K 59/123 (2023.02)

(58) Field of Classification Search
CPC .. H10K 59/124; H10K 50/814; H10K 59/122; H10K 59/123; H10K 50/813

USPC ........................................................... 257/40
See application file for complete search history.

(56) References Cited

U.S. PATENT DOCUMENTS

| | | | |
|---|---|---|---|
| 2020/0212162 A1* | 7/2020 | Fan | ...................... H10K 59/122 |
| 2022/0045155 A1* | 2/2022 | Ma | ...................... H01L 27/1248 |

FOREIGN PATENT DOCUMENTS

CN 110610980 A 12/2019

OTHER PUBLICATIONS

State Intellectual Property Office of the People's Republic of China, First Office Action, Chinese Application No. 202011538763.3, Mailed Apr. 27, 2022, 14 pages.

* cited by examiner

*Primary Examiner* — Xia L Cross
(74) *Attorney, Agent, or Firm* — Christensen O'Connor Johnson Kindness PLLC (57) ABSTRACT

A display panel and a display device are provided. The display panel includes a base substrate, a transistor layer, a planarization layer, and a light-emitting device layer. The light-emitting device layer includes: anodes; a pixel definition layer defining opening regions and non-opening regions, and part of each anode being exposed in a respective opening region; light-emitting layers corresponding to the opening regions; and cathodes located at a side of the pixel definition layer and the light-emitting layers facing away from the base substrate. The display panel further includes a first auxiliary-pad layer located at a side of planarization layer facing the base substrate, in a direction perpendicular to a plane of the base substrate, each first auxiliary-pad layer does not overlap with each opening region and extends along an extension direction of at least part of an edge of a respective opening region.

17 Claims, 11 Drawing Sheets

DISPLAY PANEL AND DISPLAY DEVICE HAVING OPENING REGIONS AND NON-OPENING REGIONS

CROSS-REFERENCE TO RELATED APPLICATIONS

The present application claims priority to Chinese Patent Application No. 202011538763.3, filed on Dec. 23, 2020, the content of which is incorporated herein by reference in its entirety.

TECHNICAL FIELD

The present disclosure relates to the field of display technology, and in particular, to a display panel and a display device.

BACKGROUND

Light-emitting devices in the display panel are mostly top light-emitting devices, among which an anode of the light-emitting devices is a reflective electrode. In the related art, surface flatness of the anode is poor. When external ambient light is incident to the anode and is reflected by the anode, the reflected light is prone to periodic diffraction, resulting in light spots. Especially, for a display panel covered with a color filter, light spots are particularly obvious under light irradiation, which creates bad visual experience for users.

SUMMARY

In view of this, embodiments of the present disclosure provide a display panel and a display device, which effectively improve the flatness of an anode and weaken the phenomenon of reflected light spots.

In an aspect, an embodiment of the present disclosure provides a display panel, including a base substrate, a transistor layer, at least one planarization layer, and a light-emitting device layer that are successively arranged along a light-exiting direction of the display panel. The light-emitting device layer includes: anodes: a pixel definition layer located at a side of the anodes facing away from the base substrate, the pixel definition layer defining opening regions and non-opening regions, and part of each of the anodes being exposed in a respective opening region of the opening regions: light-emitting layers that are located at a side of the anodes and the pixel definition layer facing away from the base substrate and correspond to the opening regions; and cathodes located at a side of the pixel definition layer and the light-emitting layers facing away from the base substrate. The display panel further includes at least one first auxiliary-pad layer located at a side of at least one planarization layer facing the base substrate, and in a direction perpendicular to a plane of the base substrate, each of the at least one first auxiliary-pad layer does not overlap with each of the opening regions, and each of the at least one first auxiliary-pad layer extends along an extension direction of at least part of an edge of a respective opening region of the opening regions.

In another aspect, an embodiment of the present disclosure provides a display device including the display panel described above.

BRIEF DESCRIPTION OF DRAWINGS

In order to more clearly illustrate technical solutions in embodiments of the present disclosure, the accompanying drawings used in the embodiments are briefly introduced as follows. It should be noted that the drawings described as follows are merely part of the embodiments of the present disclosure, and other drawings can also be acquired by those skilled in the art.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that, although the auxiliary-pad layer may be described using the terms of "first", "second", "third", etc., in the embodiments of the present disclosure, the auxiliary-pad layer will not be limited to these terms. These terms are merely used to distinguish auxiliary-pad layers from one another. For example, without departing from the scope of the embodiments of the present disclosure, a first auxiliary-pad layer may also be referred to as a second auxiliary-pad layer, similarly, a second auxiliary-pad layer may also be referred to as a first auxiliary-pad layer.

Depending on the context, the word "if" as used herein may be construed as "at the time when . . . " or "when . . . " or "responsive to determination" or "responsive to detection". Similarly, depending on the context, phrases "if . . . is determined" or "if (a stated condition or event) . . . is detected" may be construed as "when . . . is determined" or "responsive to determination" or "when (a stated condition or event) . . . is detected" or "responsive to detection of (a stated condition or event)".

Before describing the technical solutions provided in the embodiments of the present disclosure, a structure of an existing display panel will be described in the following in the present disclosure.

Figure 1:
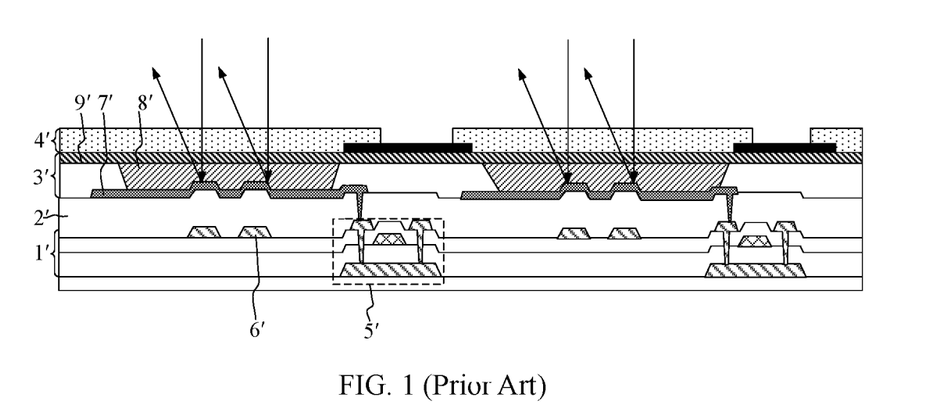
FIG. 1 is a schematic diagram of a structure of layers of a display panel in the related art.

As shown in FIG. 1, which is a schematic diagram of a structure of layers of a display panel in the related art, the display panel includes a transistor layer 1', a planarization layer 2', a light-emitting device layer 3', and a color filter 4' that are stacked along a light-exiting direction of the display panel. The transistor layer 1' is provided with a plurality of wires, such as wires for forming transistors 5' and various signal lines 6' that are connected to the transistors 5'. The light-emitting device layer 3' includes an anode 7', a light-emitting layer 8' and a cathode 9' that are stacked along the light-exiting direction of the display panel. Due to the influence of various wires in the transistor layer 1', the anode 7' has a non-flat surface and it is difficult to form a flat surface. External ambient light reflected by the anode 7' is prone to periodic diffraction, resulting in reflected light spots.

Figure 2:
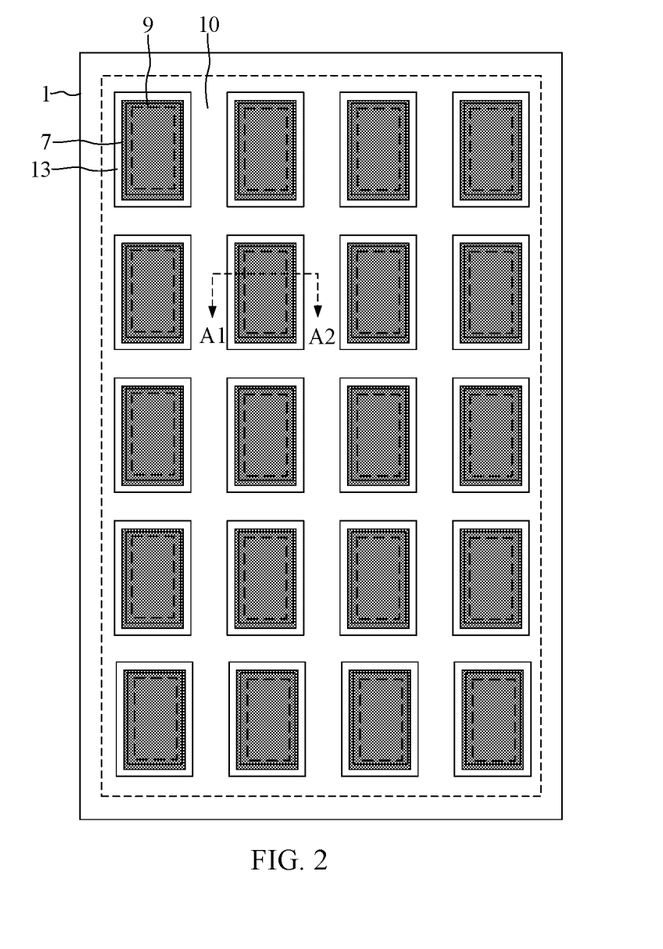
FIG. 2 is a top view of a display panel according to an embodiment of the present disclosure.
Figure 3:
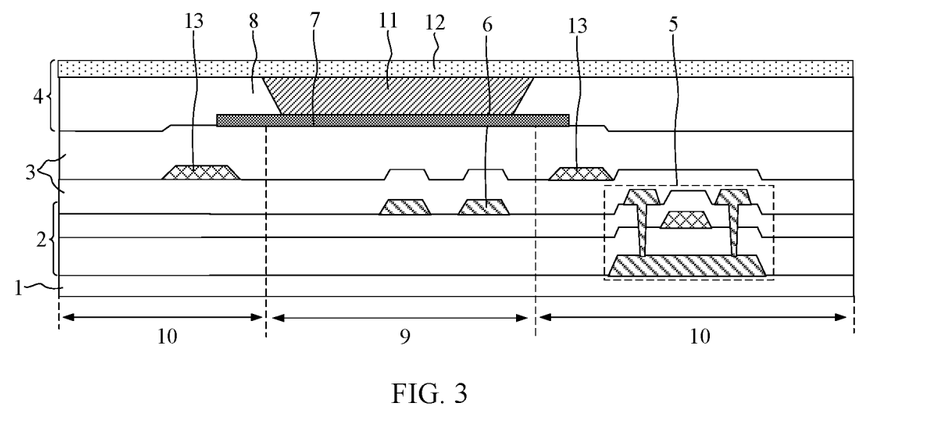
FIG. 3 is a cross-sectional view along A1-A2 shown in FIG. 2.

Therefore, an embodiment of the present disclosure provides a display panel. The display panel may be an organic light-emitting display panel. As shown in FIG. 2 and FIG. 3, where FIG. 2 is a top view of a display panel according to an embodiment of the present disclosure, and FIG. 3 is a cross-sectional view along A1-A2 shown in FIG. 2. The display panel includes a base substrate 1. Along a light-exiting direction of the display panel, the base substrate 1 is successively provided thereon with a transistor layer 2, a planarization layer 3, and a light-emitting device layer 4.

The transistor layer 2 includes a pixel driving circuit 5 and various signal lines 6 electrically connected to the pixel driving circuit 5, for example, a gate line for providing a scan signal to the pixel driving circuit 5, a data line for providing a data signal to the pixel driving circuit 5, a power signal line for providing a power signal to the pixel driving circuit 5, and a reference signal line for providing a reference signal to the pixel driving circuit 5. The planarization layer 3 may include only one layer or multiple layers. The light-emitting device layer 4 includes: an anode 7, the anode 7 being electrically connected to the pixel driving circuit 5 in the transistor layer 2 (not illustrated in the figure) and being used for receiving a driving current transmitted by the pixel driving circuit 5, the anode 7 being a reflective electrode formed by an opaque metal material: a pixel definition layer 8 located at a side of the anode 7 facing away from the base substrate 1, the pixel definition layer 8 defining an opening region 9 and a non-opening region 10, and part of the anode 7 being exposed in the opening region 9: a light-emitting layer 11 that is located at a side of the anode 7 and the pixel definition layer 8 facing away from the base substrate 1 and corresponds to the opening region 9; and a cathode 12 located at a side of the pixel definition layer 8 and the light-emitting layer 11 facing away from the base substrate 1, the cathode 12 being a transparent electrode formed by a transparent and electron-conductive material such as indium tin oxide.

In addition, the display panel further includes a first auxiliary-pad layer 13. The first auxiliary-pad layer 13 is located at a side of at least one planarization layer 3 facing the base substrate 1. When viewed from a direction perpendicular to a plane of the base substrate 1, the first auxiliary-pad layer 13 does not overlap with the opening region 9, and the first auxiliary-pad layer 13 extends along an extension direction of at least part of an edge of the opening region 9.

In this embodiment of the present disclosure, the first auxiliary-pad layer 13 does not overlap with the opening region 9 and extends along at least part of an edge of the opening region 9. That is, the first auxiliary-pad layer 13 is arranged in the non-opening region 10 to surround or semi-surround the opening region 9. When the first auxiliary-pad layer 13 is coated with an organic material to form the planarization layer 3, since the organic material has a certain fluidity, the first auxiliary-pad layer 13 may guide flowing of the organic material to some extent, making part of the organic material more prone to flow from the top of the first auxiliary-pad layer 13 to a region circumscribed by or semi-circumscribed by the first auxiliary-pad layer 13, thereby thickening the planarization layer 3 in this region. A thicker planarization layer 3 can additionally reduce non-flatness of an upper surface of the planarization layer 3, that is, of a surface of a side of the planarization layer 3 facing away from the base substrate 1, caused by a signal line 6 below the planarization layer 3, thereby reducing the non-flatness of the upper surface of the planarization layer 3. Moreover, with reference to the top view of the display panel shown in FIG. 2, from a macro perspective, a plurality of first auxiliary-pad layers 13 are densely and evenly distributed in the whole display region, and the plurality of first auxiliary-pad layers 13 may macroscopically improve the film-forming flatness of the whole planarization layer 3, thereby enabling the upper surface of the planarization layer 3 to be flat as a whole.

As it can be seen that in this embodiment of the present disclosure, the first auxiliary-pad layer 13 can be used to improve the film-forming flatness of the planarization layer 3. Moreover, the planarization layer 3 is also used for bearing the anode 7, therefore, when the anode 7 is subsequently formed above the planarization layer 3 by evaporation, the flatness of the evaporated anode 7 can be effectively improved. When external ambient light is reflected by the anode 7, periodic diffraction of the reflected light caused by the non-flatness of the anode 7 can be effectively weakened (reduced), and reflected light spots can be weakened (reduced) or even eliminated, thereby improving user experience.

In addition, it needs to be further noted that in this embodiment of the present disclosure, the first auxiliary-pad layer 13 does not overlap with the opening region 9, the first auxiliary-pad layer 13 extends, in the non-opening region 10, along at least part of an edge of the opening region 9. This not only can make a region circumscribed by or semi-circumscribed by the first auxiliary-pad layer 13 cover the entire opening region 9 to effectively improve the flatness of the planarization layer 3 at a position of the entire opening region 9, but also can avoid influence of the first auxiliary-pad layer 13 on the flatness of the light-emitting layer 11 arranged in the opening region 9 and then avoid a color offset caused by the non-flatness of the light-emitting layer 11.

Figure 4:
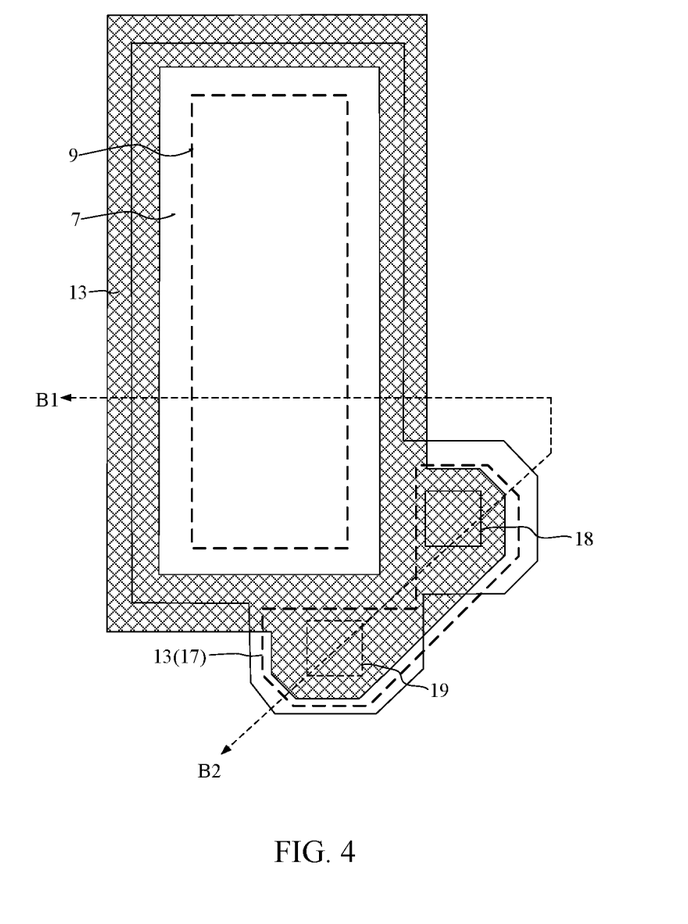
FIG. 4 is another top view of a first auxiliary-pad layer according to an embodiment of the present disclosure.
Figure 5:
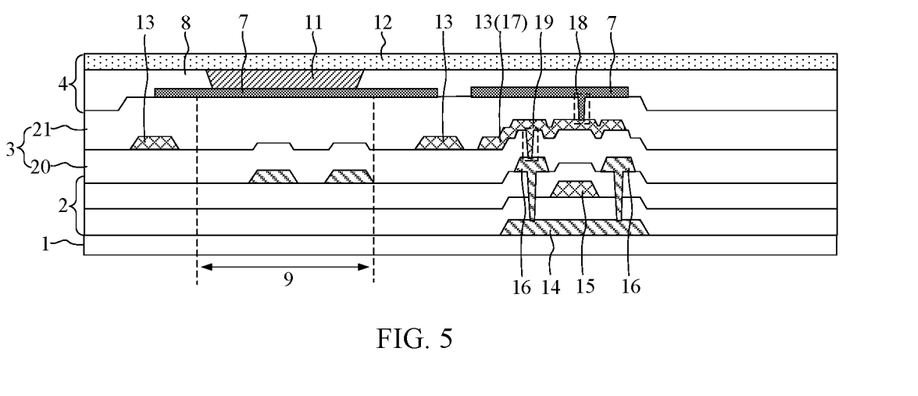
FIG. 5 is a cross-sectional view along B1-B2 shown in FIG. 4.

In an embodiment, as shown in FIG. 4 and FIG. 5, where FIG. 4 is another top view of a first auxiliary-pad layer 13 according to an embodiment of the present disclosure, and FIG. 5 is a cross-sectional view along B1-B2 shown in FIG. 4, the transistor layer 2 includes an active layer 14, a gate layer 15, and a source-drain layer 16 successively arranged along the light-exiting direction of the display panel. To improve the reliability of a connection between the source-drain layer 16 and the anode 7, the display panel further includes an auxiliary connection layer 17. The auxiliary connection layer 17 is located between the source-drain layer 16 and the anode 7, and the source-drain layer 16 is electrically connected to the anode 7 through the auxiliary connection layer 17. Based on this, in this embodiment of the present disclosure, the first auxiliary-pad layer 13 may be formed by an electron-conductive material, and part of the first auxiliary-pad layer 13 is reused as the auxiliary connection layer 17.

That is, part of the first auxiliary-pad layer 13 extends along at least part of an edge of the opening region 9 to increase a thickness of the planarization layer 3 below the anode 7, and the other part of the first auxiliary-pad layer 13 is reused as the auxiliary connection layer 17 and is respectively electrically connected to the source-drain layer 16 and the anode 7 via a through-hole, to improve the reliability of the connection between the source-drain layer 16 and the anode 7. The first auxiliary-pad layer 13 plays roles of optimizing the flatness of the planarization layer 3 and improving the signal transmission quality. Moreover, the first auxiliary-pad layer 13 and the auxiliary connection layer 17 can be formed by a same formation process and occupy a space of only one layer, which not only reduces a production process and reduces production costs, but also is more conducive to the thinning design of the display panel.

It needs to be noted that, referring to FIG. 4 and FIG. 5 again, the anode 7 is electrically connected to the auxiliary connection layer 17 through a first through-hole 18. The auxiliary connection layer 17 is electrically connected to the source-drain layer 16 through a second through-hole 19. When viewing from a direction perpendicular to the plane of the base substrate 1, the first through-hole 18 may not be aligned to the second through-hole 19.

It should be understood that when an auxiliary connection layer 17 is arranged between the source-drain layer 16 and the anode 7 and part of the first auxiliary-pad layer 13 is reused as the auxiliary connection layer 17, the planarization layer 3 includes at least two layers. Moreover, a plurality of planarization layers 3 may be arranged between the first auxiliary-pad layer 13 and the anode 7.

In this embodiment of the present disclosure, referring to FIG. 5 again, the planarization layer 3 includes a first planarization layer 20 and a second planarization layer 21 that are stacked. The first auxiliary-pad layer 13 is located between the first planarization layer 20 and the second planarization layer 21. Based on this structure, only one second planarization layer 21 is arranged between the first auxiliary-pad layer 13 and the anode 7. The film-forming flatness of the second planarization layer 21 is optimized by using the first auxiliary-pad layer 13, so that after an upper surface of the second planarization layer 21 tends to be flat, the anode 7 is directly formed above the second planarization layer 21 by evaporation. No other film layer is arranged between the second planarization layer 21 and anode 7, so the second planarization layer 21 can be used to significantly improve the flatness of the anode 7. Moreover, in such a configuration, the planarization layer 3 includes only two layers, so an overall layer thickness will not be excessive, and the influence on the thickness of the display panel can be reduced.

Figure 6:
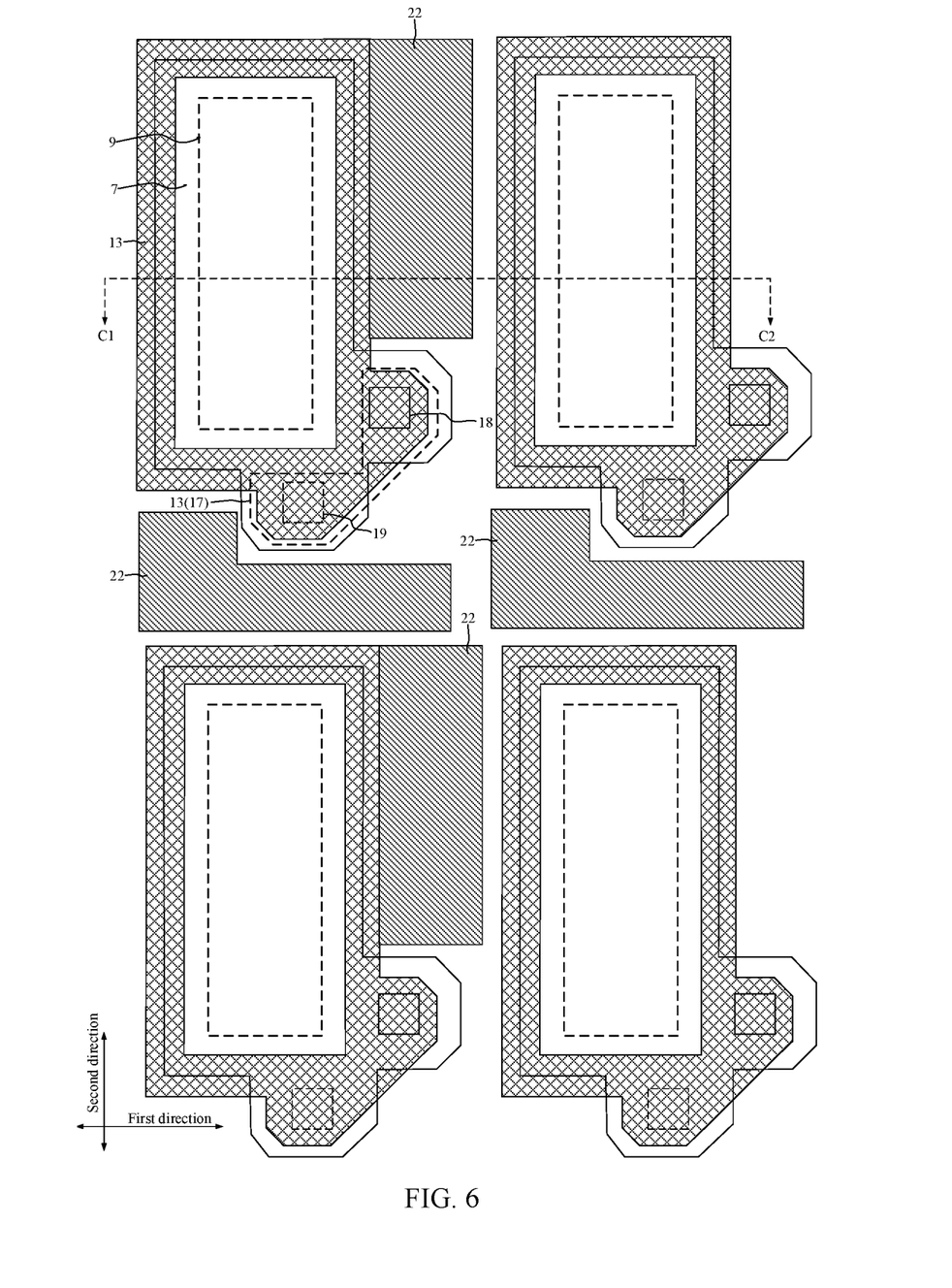
FIG. 6 is a top view of a second auxiliary-pad layer according to an embodiment of the present disclosure.
Figure 7:
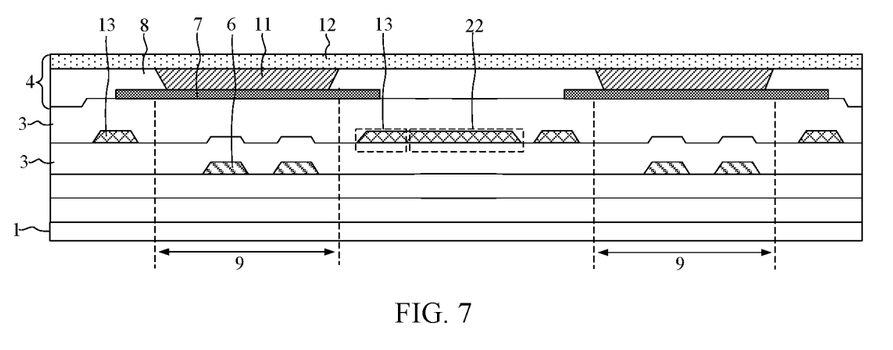
FIG. 7 is a cross-sectional view along C1-C2 shown in FIG. 6.

In one embodiment, as shown in FIG. 6 and FIG. 7, where FIG. 6 is a top view of a second auxiliary-pad layer 22 according to an embodiment of the present disclosure, and FIG. 7 is a cross-sectional view along C1-C2 shown in FIG. 6. The display panel further includes a second auxiliary-pad layer 22 arranged in the same layer as the first auxiliary-pad layer 13. When viewed from the direction perpendicular to the plane of the base substrate 1, the second auxiliary-pad layer 22 is located between two adjacent opening regions 9 in a first direction and/or in a second direction, and the second auxiliary-pad layer is connected to at most one first auxiliary-pad layer 13. The first direction intersects the second direction. In an example, the first direction is an extension direction of the gate line, and the second direction is an extension direction of the data line: or the first direction is an extension direction of the data line, and the second direction is an extension direction of the gate line.

By further providing the second auxiliary-pad layer 22 to surround the first auxiliary-pad layer 13, when an organic material is coated to form the planarization layer 3, the second auxiliary-pad layer 22 occupies a flowing space of part of the organic material, so that most of the organic material flows into a region circumscribed by or semi-circumscribed by the first auxiliary-pad layer 13 to thicken the planarization layer 3 in this region to a greater extent. Moreover, the second auxiliary-pad layer 22 can make the deviated organic material flow back to the region circumscribed by or semi-circumscribed by the first auxiliary-pad layer 13, and at the same time, can avoid excessive accumulation of the organic material at an edge of the anode 7 in the non-opening region or at an edge of the anode in the opening region 9, thereby more effectively weakening non-flatness of an upper surface of the planarization layer 3 and thus improving the flatness of the anode 7.

Moreover, when part of the first auxiliary-pad layer 13 is reused as the auxiliary connection layer 17 and the first auxiliary-pad layer 13 is connected to the second auxiliary-pad layer 22, equivalent load resistance of the first auxiliary-pad layer 13 is reduced. When a current driving signal of the source-drain layer 16 is transmitted to the anode 7 through the part of the first auxiliary-pad layer 13 which is reused as the auxiliary connection layer 17, voltage drop of the signal can be reduced, thereby improving the accuracy of luminance of the light-emitting device.

Figure 8:
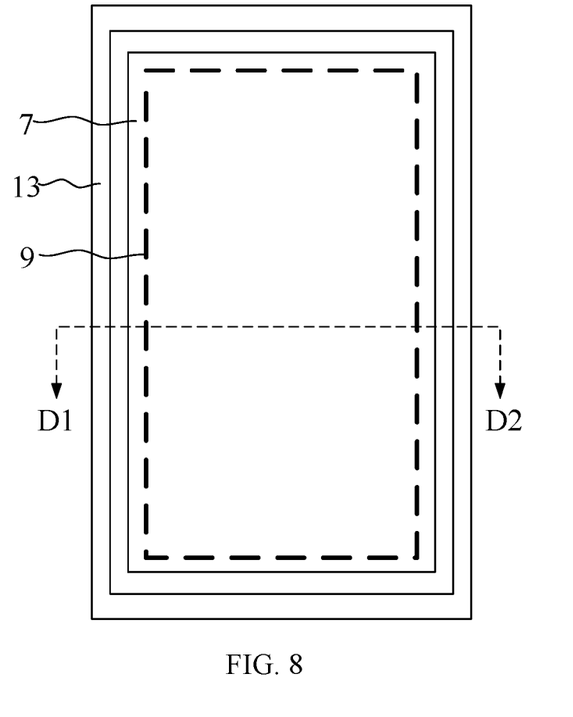
FIG. 8 is another top view of a first auxiliary-pad layer according to an embodiment of the present disclosure.
Figure 9:
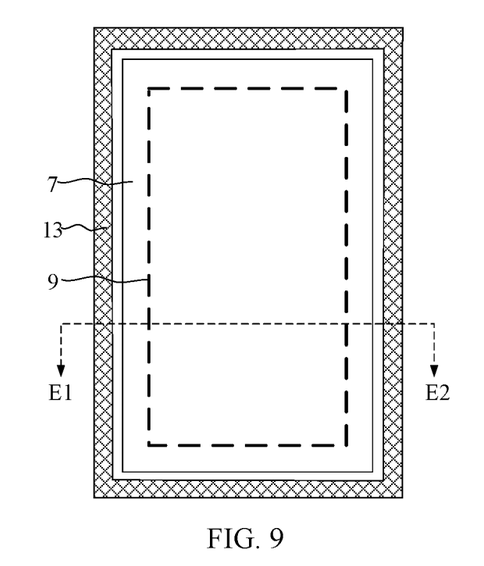
FIG. 9 is another schematic structural diagram of a first auxiliary-pad layer according to an embodiment of the present disclosure.

In one embodiment, as shown in FIG. 8 and FIG. 9, where FIG. 8 is another top view of a first auxiliary-pad layer 13 according to an embodiment of the present disclosure, and FIG. 9 is another schematic structural diagram of a first auxiliary-pad layer 13 according to an embodiment of the present disclosure, the first auxiliary-pad layer 13 is arranged to surround the opening region 9. In this case, the first auxiliary-pad layer 13 is a closed pad layer structure surrounding the opening region 9. The first auxiliary-pad layer 13 has a more obvious guiding effect on the flowing of the organic material for forming the planarization layer 3, thereby further significantly improving the film-forming flatness of the planarization layer 3 and further improving the flatness of the anode 7 to a greater extent.

Figure 10:
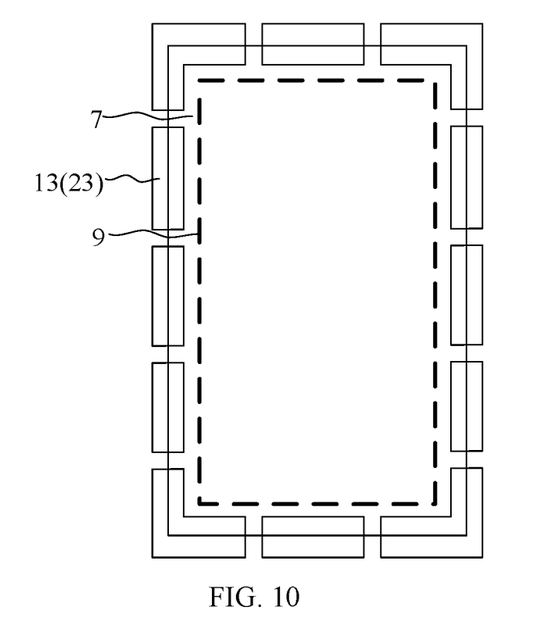
FIG. 10 is another top view of a first auxiliary-pad layer according to an embodiment of the present disclosure.
Figure 11:
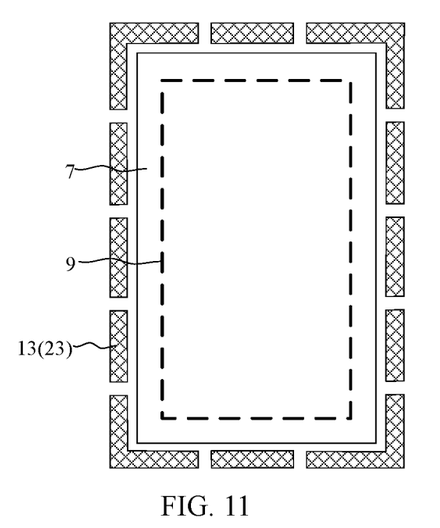
FIG. 11 is another top view of a first auxiliary-pad layer according to an embodiment of the present disclosure.

In another embodiment, the first auxiliary-pad layer 13 may also be a non-closed pad layer structure surrounding the opening region 9. For example, as shown in FIG. 10 and FIG. 11, where FIG. 10 is another top view of a first auxiliary-pad layer 13 according to an embodiment of the present disclosure, and FIG. 11 is another top view of a first auxiliary-pad layer 13 according to an embodiment of the present disclosure, the first auxiliary-pad layer 13 includes a plurality of auxiliary-pad layer portions 23. The plurality of auxiliary-pad layer portions 23 are arranged along the edge of the opening region 9, and two adjacent auxiliary-pad layer portions 23 are spaced apart from each other. In this case, the first auxiliary-pad layer 13 is still arranged to surround the entire opening region 9, and the first auxiliary-pad layer 13 still can have a guiding effect on the flowing of the organic material for forming the planarization layer 3, thereby improving the film-forming flatness of the planarization layer 3.

In addition, it needs to be further noted that in the layout design of different display panels, the signal lines 6 and the pixel driving circuits 5 in the respective transistor layers 2 are arranged at different positions, so the wirings in the respective transistor layers 2 have different effects on the flatness of the respective anodes 7.

Figure 12:
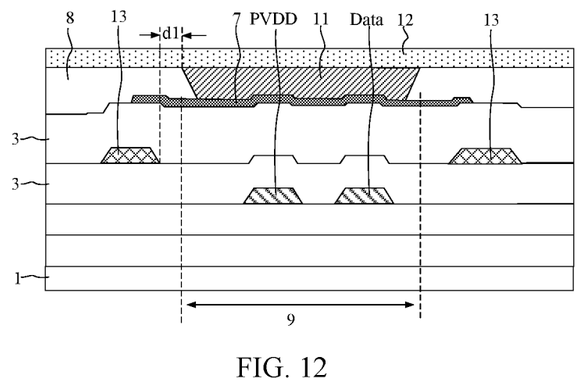
FIG. 12 is a cross-sectional view along D1-D2 shown in FIG. 8.

For example, when part of the signal lines 6 in the transistor layer 2, such as the data line Data and the power signal line PVDD, extend through the opening region 9, the wiring of this part of lines may raise a local position of the planarization layer 3. After the thickness of the planarization layer 3 is increased by using the first auxiliary-pad layer 13, the planarization layer 3 may bulge upward still at positions of the data line Data and the power signal line PVDD. Therefore, in combination with FIG. 8 and FIG. 10, as shown in FIG. 12, which is a cross-sectional view along D1-D2 shown in FIG. 8, the first auxiliary-pad layer 13 may overlap with a part of the anode 7 which is located in the non-opening region 10. In this case, the first auxiliary-pad layer 13 can further raise an edge part of the anode 7 overlapping with it, thereby compensating for a height difference of bulge of a middle part of the anode 7 caused by the data line Data and the power signal line PVDD and thus further optimizing the overall flatness of the anode 7.

It needs to be noted that when the data line Data and the power signal line PVDD extend through the opening region 9, the first auxiliary-pad layer 13 may be arranged in a manner as shown in FIG. 8. The first auxiliary-pad layer 13 is a closed pad layer structure overlapping with the edge part of the anode 7, so that the edge part of the anode 7 can be raised in an all-round way by using the first auxiliary-pad layer 13, thereby weakening a height difference at each position of the middle part and the edge part of the anode 7 in an all-round way.

In addition, it needs to be further noted that when part of the first auxiliary-pad layer 13 is reused as the auxiliary connection layer 17, the part of the first auxiliary-pad layer 13 overlapping with the edge part of the anode 7 may further play a role of shielding electrodes to avoid signal interference between adjacent anodes 7, thereby improving the accuracy of a signal transmitted on the anodes 7.

Further, referring to FIG. 12 again, when viewing from the direction perpendicular to the plane of the base substrate 1, a minimum distance between the first auxiliary-pad layer 13 and the opening region 9 is greater than 2 μm. It should be noted that referring to FIG. 12 again, when a groove in the pixel definition layer 8 is used for defining the opening region 9 is in a shape of an inverted trapezoidal, the opening region 9 in this embodiment of the present disclosure refers to a region defined by an edge of a surface of the pixel definition layer 8 at a side of the pixel definition layer 8 facing away from the base substrate 1. That is, the minimum distance between the first auxiliary-pad layer 13 and the opening region 9 refers to a minimum distance, when viewing from the direction perpendicular to the plane of the base substrate 1, between the first auxiliary-pad layer 13 and the edge of the surface of the pixel definition layer 8 at a side of the pixel definition layer 8 facing away from the base substrate 1. In addition, it needs to be further noted that, when part of the first auxiliary-pad layer 13 is reused as the auxiliary connection layer 17, the minimum distance d1 between the first auxiliary-pad layer 13 and the opening region 9 being greater than 2 μm is not used for defining a distance between the part of the first auxiliary-pad layer 13 reused as the auxiliary connection layer 17 and the opening region 9.

It should be understood that an actual formation position of the first auxiliary-pad layer 13 may change due to influence of factors such as process accuracy. If the distance between the first auxiliary-pad layer 13 and the opening region 9 is too small, the position of the first auxiliary-pad layer 13 may overlap with the opening region 9 after moving toward the opening region 9. In this case, the first auxiliary-pad layer 13 may affect flatness of the light-emitting layer 11 arranged in the opening region 9. In this embodiment of the present disclosure, the minimum distance d1 between the first auxiliary-pad layer 13 and the opening region 9 is greater than 2 μm, which is greater than a process error, therefore, even if the position of the first auxiliary-pad layer 13 moves toward the opening region 9, a risk of the first auxiliary-pad layer 13 overlapping with the opening region 9 can still be reduced, thereby avoiding the problem such as a color offset caused by the non-flatness of the light-emitting layer 11.

In addition, it needs to be further noted that, in order to achieve color display, the opening region 9 defined by pixel definition layer 8 includes a red opening region for emitting red light, a green opening region for emitting green light, and a blue opening region for emitting blue light. In actual applications, on a precondition that the minimum distance d1 between the first auxiliary-pad layer 13 and each opening region 9 is greater than 2 μm, a distance between the first auxiliary-pad layer 13 and the red opening region, a distance between the first auxiliary-pad layer 13 and the green opening region, and a distance between the first auxiliary-pad layer 13 and the blue opening region may be equal to each other or different from each other.

Figure 13:
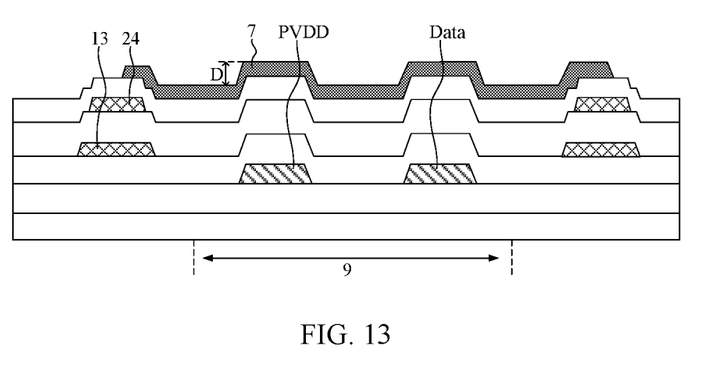
FIG. 13 is a schematic structural diagram of a third auxiliary-pad layer according to an embodiment of the present disclosure.

Further, as shown in FIG. 13, which is a schematic structural diagram of a third auxiliary-pad layer according to an embodiment of the present disclosure, due to the influence of the wiring below the anode 7, a local portion of the anode 7 in the opening region 9 bulges upward, and the anode 7 has a maximum height difference D. Therefore, the display panel further includes a third auxiliary-pad layer 24. When viewing from the direction perpendicular to the plane of the base substrate 1, the third auxiliary-pad layer 24 overlaps with the first auxiliary-pad layer 13, and a sum of a thicknesses of the third auxiliary-pad layer 24 and a thickness of the first auxiliary-pad layer 13 is equal to the maximum height difference D.

If the maximum height difference D of the anode 7 is relatively large, it is difficult for a layer thickness of a single first auxiliary-pad layer 13 to compensate for. Therefore, a third auxiliary-pad layer 24 may be superimposed at the position of the first auxiliary-pad layer 13, then a sum of a thicknesses of the first auxiliary-pad layer 13 and a thickness of the third auxiliary-pad layer 24 can be used to compensate for the maximum height difference D of the anode 7 in the opening region 9, so as to fully raise the edge part of the anode 7 and then reduce, to a greater extent, the non-flatness between the edge part and the middle part of the anode 7.

Figure 14:
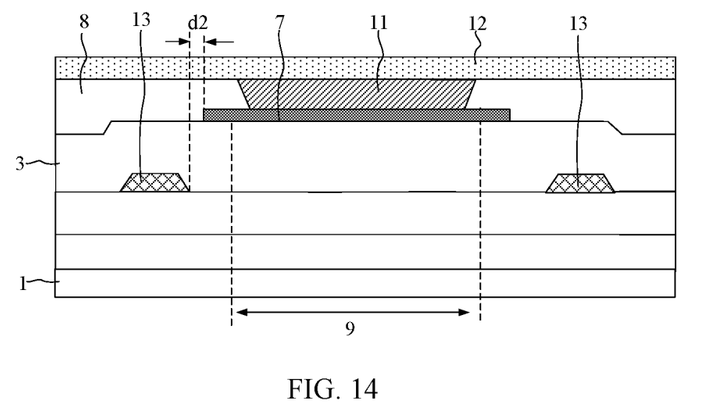
FIG. 14 is a cross-sectional view along E1-E2 shown in FIG. 9.

In one embodiment, the non-flatness between the middle part and the edge part of the anode 7 is smaller, so that after the thickness of the planarization layer 3 is increased by using the first auxiliary-pad layer 13, the planarization layer 3 tends to be flat and then the anode 7 tends to be flat. Therefore, there is no need to use the first auxiliary-pad layer 13 to raise the edge part of the anode 7 too high. In this case, referring to FIG. 9 and FIG. 11 again, as shown in FIG. 14, which is a cross-sectional view along E1-E2 shown in FIG. 9, the first auxiliary-pad layer 13 does not overlap with the part of the anode 7 in the non-opening region 10, and the overall flatness of the anode 7 is improved only by optimizing the film-forming flatness of the planarization layer 3.

Further, in order to avoid affecting the flatness of the anode 7 due to the overlap between the first auxiliary-pad layer 13 and the edge part of the anode 7 caused by factors such as process accuracy, referring to FIG. 14 again, when viewing from the direction perpendicular to the plane of the base substrate 1, a minimum distance d2 between the first auxiliary-pad layer 13 and the anode 7 can be greater than 2 μm.

Figure 15:
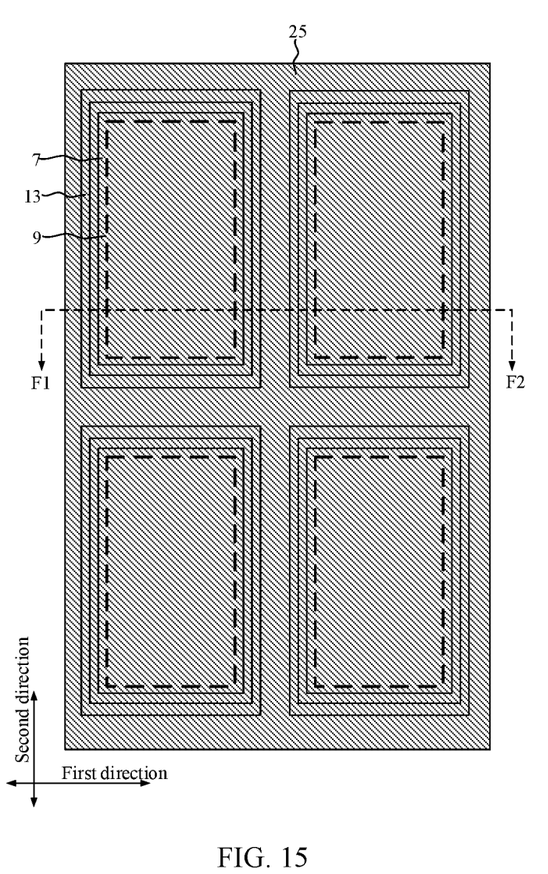
FIG. 15 is a top view of a fourth auxiliary-pad layer according to an embodiment of the present disclosure.

In one embodiment, as shown in FIG. 15, which is a top view of a fourth auxiliary-pad layer 25 according to an embodiment of the present disclosure, the display panel further includes a fourth auxiliary-pad layer 25. The fourth auxiliary-pad layer 25 is located at a side of at least one planarization layer 3 facing the base substrate 1. When viewed from the direction perpendicular to the plane of the base substrate 1, the fourth auxiliary-pad layer 25 is located between two adjacent opening regions 9 in a first direction and/or in a second direction. After the fourth auxiliary-pad layer 25 is further provided to surround the first auxiliary-pad layer 13, when coating an organic material to form the planarization layer 3, most of the organic material can flow into a region circumscribed by or semi-circumscribed by the first auxiliary-pad layer 13, thereby thickening the planarization layer 3 in this region to a greater extent, which more significantly optimizes the film-forming flatness of the planarization layer 3 and thus improves the flatness of the anode.

Figure 16:
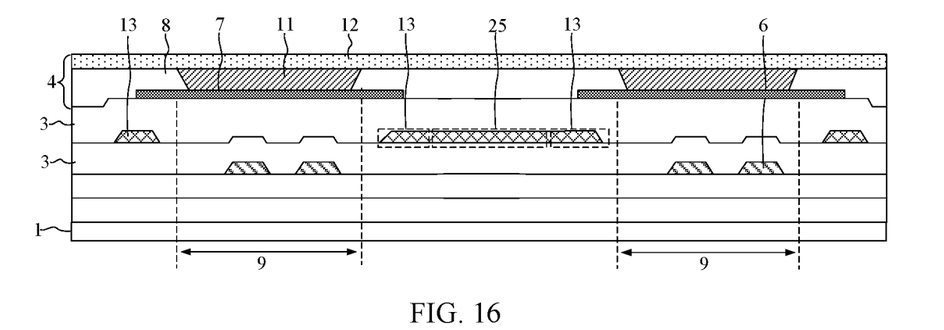
FIG. 16 is a cross-sectional view along F1-F2 shown in FIG. 15.

Further, as shown in FIG. 16, which is a cross-sectional view along F1-F2 shown in FIG. 15, to simplify a production process of the fourth auxiliary-pad layer 25, the fourth auxiliary-pad layer 25 may be arranged in the same layer as the first auxiliary-pad layer 13. Moreover, two adjacent first auxiliary-pad layers 13 are connected through the fourth auxiliary-pad layer. In this case, the fourth auxiliary-pad layer 25 and the first auxiliary-pad layers 13 are connected together. As a result, there is no gap between the fourth auxiliary-pad layer 25 and the first auxiliary-pad layers 13, and the organic material for forming the planarization layer 3 is more prone to flow toward the region circumscribed by or semi-circumscribed by the first auxiliary-pad layer 13, thereby further thickening the planarization layer 3 below the anode 7.

Figure 17:
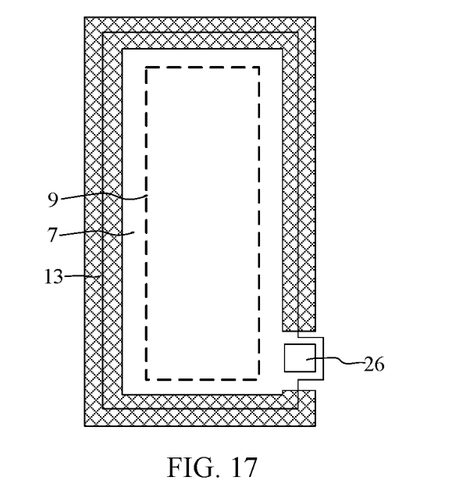
FIG. 17 is another top view of a first auxiliary-pad layer according to an embodiment of the present disclosure.
Figure 18:
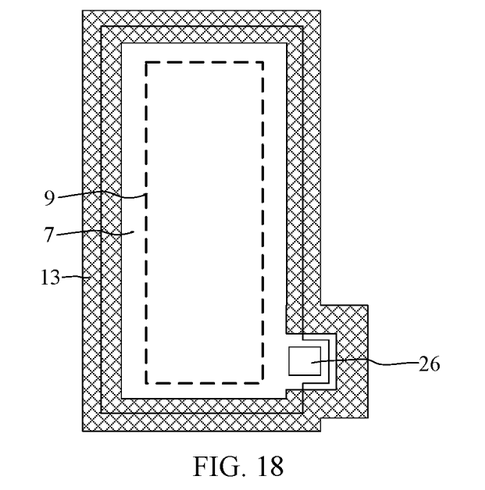
FIG. 18 is another top view of a first auxiliary-pad layer according to an embodiment of the present disclosure.

In one embodiment, as shown in FIG. 17 and FIG. 18, where FIG. 17 is another top view of a first auxiliary-pad layer 13 according to an embodiment of the present disclosure, and FIG. 18 is another top view of a first auxiliary-pad layer 13 according to an embodiment of the present disclosure, the display panel further includes a line-changing through-hole 26 arranged adjacent to the opening region 9. The line-changing through-hole 26 runs through the planarization layer 3. For example, the line-changing through-hole 26 may be a through-hole between the anode 7 and the source-drain layer 16. When the first auxiliary-pad layer 13 extends along an edge of the opening region 9, the first auxiliary-pad layer 13 may bypass the line-changing through-hole 26 so as to avoid the influence of the first auxiliary-pad layer 13 on the through-hole. For example, referring to FIG. 17 again, the first auxiliary-pad layer 13 is discontinuous at a position of the line-changing through-hole 26: or referring to FIG. 18 again, the first auxiliary-pad layer 13 is wound along one side of the line-changing through-hole 26 away from the opening region 9. When the first auxiliary-pad layer 13 is wound along one side of the line-changing through-hole 26 away from the opening region 9, the first auxiliary-pad layer 13 may be further electrically connected to a fixed-potential signal end, so that the first auxiliary-pad layer 13 plays a role of shielding electrodes and shielding the influence of other signals on a signal that is transmitted by the line-changing through-hole 26.

It should be understood that when the first auxiliary-pad layer 13 is discontinuous or wound at the line-changing through-hole 26, the fourth auxiliary-pad layer 25 may still be further arranged to surround the first auxiliary-pad layer 13 as shown in FIG. 15. The first auxiliary-pad layer 13 is in communication with the fourth auxiliary-pad layer 25, to further improve the film-forming flatness of the planarization layer 3.

Figure 19:
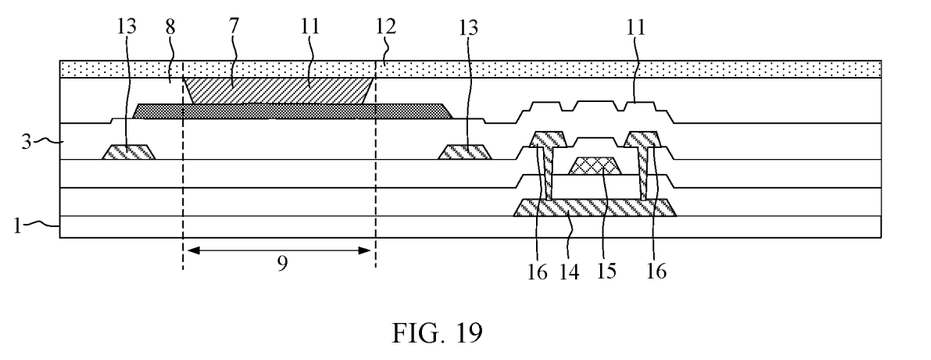
FIG. 19 is another cross-sectional view along A1-A2 shown in FIG. 2.

In one embodiment, as shown in FIG. 19, which is another cross-sectional view along A1-A2 shown in FIG. 2, the transistor layer 2 includes an active layer 14, a gate layer 15, and a source-drain layer 16 that are successively arranged along the light-exiting direction, and the first auxiliary-pad layer 13 is arranged in the same layer as the source-drain layer 16. In this case, the first auxiliary-pad layer 13 and the source-drain layer 16 can be formed by a same formation process, thereby saving a production process for additionally forming the first auxiliary-pad layer 13 and reducing production costs. It needs to be noted that when the first auxiliary-pad layer 13 is arranged in the same layer as the source-drain layer 16, only one planarization layer 3 may be provided between the source-drain layer 16 and the anode 7, and the planarization layer 3 is in direct contact with the first auxiliary-pad layer 13 and the anode 7, respectively. After the first auxiliary-pad layer 13 optimizes the flatness of the planarization layer 3, the flatness of the anode 7 is optimized directly by using the optimized flatness of the planarization layer 3, which can significantly improve the flatness of the anode 7. Moreover, a single planarization layer 3 does not have an extremely large thickness, which is more conducive to the thinning design of the display panel.

In one embodiment, a width of the first auxiliary-pad layer 13 in a direction perpendicular to an extension direction thereof is positively correlated with a width of the non-opening region 10 where the first auxiliary-pad layer 13 is located. If the width of the non-opening region 10 where the first auxiliary-pad layer 13 is located is large, the width of the first auxiliary-pad layer 13 may be set to be larger, so as to improve the film-forming flatness of the planarization layer 3 to a greater extent. If the width of the non-opening region 10 where the first auxiliary-pad layer 13 is located is small, the width of the first auxiliary-pad layer 13 may be set to be smaller, so as to avoid affecting the flatness of the light-emitting layer 8 in the opening region 9 due to the overlap between the first auxiliary-pad layer 13 and the opening region 9 caused by the influence of factors such as process accuracy.

Figure 20:
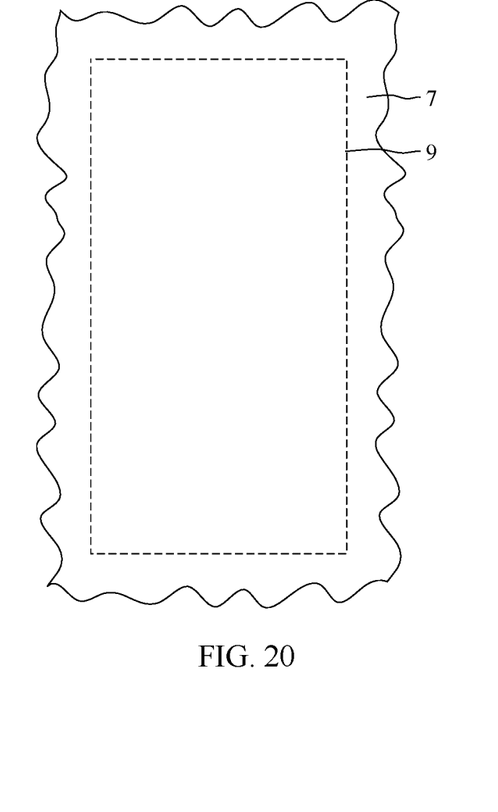
FIG. 20 is a schematic diagram of a shape of an anode according to an embodiment of the present disclosure.

In one embodiment, as shown in FIG. 20, which is a schematic diagram of a shape of an anode 7 according to an embodiment of the present disclosure, at least part of an edge of the anode 7 is non-linear, so as to break periodic diffraction of reflected light reflected by the anode 7, and to avoid subsequent constructive interference and cancellation interference and weaken the light spots.

Further, on the basis of alleviating the diffraction, the edge of the anode 7 has a shape of polyline or wavy line so as to improve the regularity of the shape of the anode 7.

Figure 21:
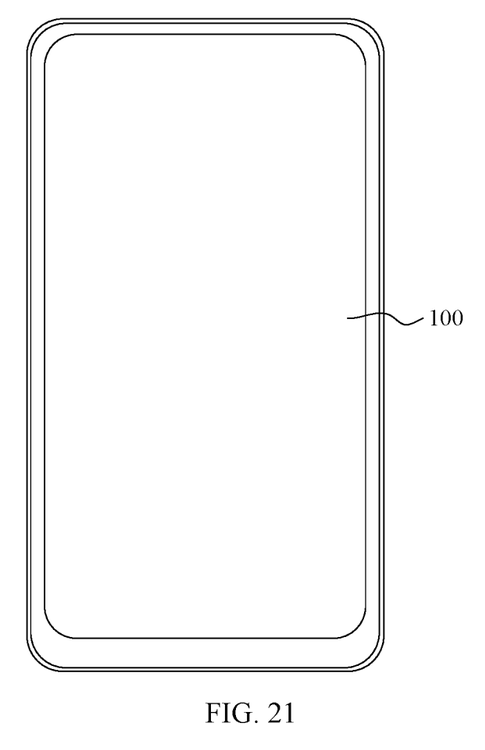
FIG. 21 is a schematic structural diagram of a display device according to an embodiment of the present disclosure.

Based on the same inventive concept, an embodiment of the present disclosure further provides a display device. As shown in FIG. 21, which is a schematic structural diagram of a display device according to an embodiment of the present disclosure, the display device includes the display panel 100 described above. A detailed structure of the display panel 100 has been described in the above embodiments, and will not be repeated herein. It should be noted that, the display device shown in FIG. 21 is merely schematic, and the display device may be any electronic device with a display function, such as a mobile phone, a tablet computer, a notebook computer, an e-book, or a television.

Since the display device according to this embodiment of the present disclosure includes the display panel 100 described above, in the display device, the first auxiliary-pad layer 13 is arranged in the non-opening region 10 to surround or semi-surround the opening region 9. When the first auxiliary-pad layer 13 is coated with an organic material to form the planarization layer 3, part of the organic material is prone to flow from the top of the first auxiliary-pad layer 13 to a region circumscribed by or semi-circumscribed by the first auxiliary-pad layer 13, thereby thickening the planarization layer 3 in this region. A thicker planarization layer 3 can lead to a greater flatness of an upper surface of the planarization layer 3, that is, of a surface of the planarization layer 3 at a side of the planarization layer 3 facing away from the base substrate 1, caused by a signal line 6 below the planarization layer 3. This results in further weakening (reducing) the non-flatness of the upper surface of the planarization layer 3, so as to make the upper surface of the planarization layer 3 tend to be flat as a whole. Then, when an anode 7 is subsequently formed above the planarization layer 3 by evaporation, the flatness of the evaporated anode 7 can be improved, and when external ambient light is reflected by the anode 7 a periodic diffraction of the reflected light caused by the non-flatness of the anode 7 can be effectively weakened, and the reflected light spots can be weakened or even eliminated, thereby improving user experience.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising: a base substrate, a transistor layer, at least one planarization layer, and a light-emitting device layer that are successively arranged along a light-exiting direction of the display panel,
wherein the light-emitting device layer comprises: anodes; a pixel definition layer located at a side of the anodes facing away from the base substrate, the pixel definition layer defining opening regions and non-opening regions, and part of one of the anodes being exposed in a respective opening region of the opening regions; light-emitting layers that are located at a side of the anodes and the pixel definition layer facing away from the base substrate and correspond to the opening regions; and cathodes located at a side of the pixel definition layer and the light-emitting layers facing away from the base substrate;
wherein the display panel further comprises at least one first auxiliary-pad layer located at a side of at least one planarization layer facing the base substrate; and wherein in a direction perpendicular to a plane of the base substrate, the at least one first auxiliary-pad layer does not overlap with the opening regions, and wherein one of the at least one first auxiliary-pad layer extends along an extension direction of at least part of an edge of a respective opening region of the opening regions;
wherein the transistor layer comprises an active layer, a gate layer, and a source-drain layer that are successively arranged along the light-exiting direction of the display panel, the display panel further comprises an auxiliary connection layer that is located between the source-drain layer and the anode, and the source-drain layer is electrically connected to the anode through the auxiliary connection layer; and one of the at least one first auxiliary-pad layer is formed by an electron-conductive material, and part of the at least one first auxiliary-pad layer is reused as the auxiliary connection layer; and
wherein the display panel further comprises at least one second auxiliary-pad layer arranged in the same layer as the at least one first auxiliary-pad layer, wherein in the direction perpendicular to the plane of the base substrate, one of the at least one second auxiliary-pad layer is located between two adjacent opening regions of the opening regions in at least one of a first direction or a second direction, one of the at least one second auxiliary-pad layer is electrically connected to only one first auxiliary-pad layer, and the first direction intersects the second direction.

2. The display panel according to claim 1, wherein the planarization layer comprises a first planarization layer and a second planarization layer that are mutually stacked, and the at least one first auxiliary-pad layer is located between the first planarization layer and the second planarization layer.

3. The display panel according to claim 1, wherein one of the at least one first auxiliary-pad layer is arranged to surround a respective opening region of the opening regions.

4. The display panel according to claim 1, wherein one of the at least one first auxiliary-pad layer comprises a plurality of auxiliary-pad layer portions, which are arranged along the edge of the opening region, and any two adjacent auxiliary-pad layer portions are spaced apart from each other.

5. The display panel according to claim 1, wherein one of the at least one first auxiliary-pad layer overlaps with a part of a respective anode of the anodes located in a respective non-opening region of the non-opening regions.

6. The display panel according to claim 5, wherein in the direction perpendicular to the plane of the base substrate a minimum distance between one of the at least one first auxiliary-pad layer and a respective opening region of the opening regions is greater than 2 µm.

7. The display panel according to claim 5, wherein one of the anodes in the opening region has a maximum height difference, the display panel further comprises at least one third auxiliary-pad layer; and wherein in the direction perpendicular to the plane of the base substrate, the at least one third auxiliary-pad layer overlaps with the at least one first auxiliary-pad layer, and wherein a sum of a thicknesses of the at least one third auxiliary-pad layer and a thickness of the at least one first auxiliary-pad layer is equal to the maximum height difference.

8. The display panel according to claim 1, wherein:
one of the at least one first auxiliary-pad layer does not overlap with a part of one of the anodes that is located in a respective non-opening region of the non-opening regions.

9. The display panel according to claim 8, wherein:
in the direction perpendicular to the plane of the base substrate, a minimum distance between one of the at least one first auxiliary-pad layer and a respective anode of the anodes is greater than 2 µm.

10. The display panel according to claim 1, further comprising at least one fourth auxiliary-pad layer, wherein the at least one fourth auxiliary-pad layer is located at a side of at least one planarization layer facing the base substrate, and wherein in the direction perpendicular to the plane of the base substrate, one of the at least one fourth auxiliary-pad layer is located between two adjacent opening regions of the opening regions in a first direction and/or in a second direction.

11. The display panel according to claim 10, wherein the at least one fourth auxiliary-pad layer is arranged in the same layer as the at least one first auxiliary-pad layer, and wherein two adjacent first auxiliary-pad layers of the at least one first auxiliary-pad layer are connected through a respective fourth auxiliary-pad layer of the at least one fourth auxiliary-pad layer.

12. The display panel according to claim 1, further comprising line-changing through-holes arranged adjacent to the opening regions,
wherein one of the at least one first auxiliary-pad layer is discontinuous at a position of a respective line-changing through-hole of the line-changing through-holes, or one of the at least one first auxiliary-pad layer is wound along a side of a respective line-changing through-hole of the line-changing through-holes away from the opening region.

13. The display panel according to claim 1, wherein the at least one first auxiliary-pad layer is arranged in the same layer as the source-drain layer.

14. The display panel according to claim 1, wherein a width of one of the at least one first auxiliary-pad layer in a direction perpendicular to an extension direction of the first auxiliary-pad layer is positively correlated with a width of a respective non-opening region of the non-opening regions at a location where the first auxiliary-pad layer is located.

15. The display panel according to claim 1, wherein one of the anodes has a partially non-linear edge.

16. The display panel according to claim 15, wherein the edge of one of the anodes has a shape of a polyline or of a wavy line.

17. A display device, comprising a display panel comprising: a base substrate, a transistor layer, at least one planarization layer, and a light-emitting device layer that are successively arranged along a light-exiting direction of the display panel,
wherein the light-emitting device layer comprises: anodes; a pixel definition layer located at a side of the anodes facing away from the base substrate, the pixel definition layer defining opening regions and non-opening regions, and part of one of the anodes being exposed in a respective opening region of the opening regions; light-emitting layers that are located at a side of the anodes and the pixel definition layer facing away from the base substrate and correspond to the opening regions; and cathodes located at a side of the pixel definition layer and the light-emitting layers facing away from the base substrate;
wherein the display panel further comprises at least one first auxiliary-pad layer located at a side of at least one planarization layer facing the base substrate; and wherein in a direction perpendicular to a plane of the base substrate, the at least one first auxiliary-pad layer does not overlap with the opening regions, and wherein one of the at least one first auxiliary-pad layer extends along an extension direction of at least part of an edge of a respective opening region of the opening regions;
wherein the transistor layer comprises an active layer, a gate layer, and a source-drain layer that are successively arranged along the light-exiting direction of the display panel, the display panel further comprises an auxiliary connection layer that is located between the source-drain layer and the anode, and the source-drain layer is electrically connected to the anode through the auxiliary connection layer; and one of the at least one first auxiliary-pad layer is formed by an electron-conductive material, and part of the at least one first auxiliary-pad layer is reused as the auxiliary connection layer; and
wherein the display panel further comprises at least one second auxiliary-pad layer arranged in the same layer as the at least one first auxiliary-pad layer, wherein in the direction perpendicular to the plane of the base substrate, one of the at least one second auxiliary-pad layer is located between two adjacent opening regions of the opening regions in at least one of a first direction or a second direction, one of the at least one second auxiliary-pad layer is electrically connected to only one first auxiliary-pad layer, and the first direction intersects the second direction.

* * * * *